United States Patent [19]

Ishii

[11] 4,264,867
[45] Apr. 28, 1981

[54] DEMODULATOR CIRCUIT FOR FREQUENCY-MODULATED SIGNAL

[75] Inventor: Eiichi Ishii, Tokyo, Japan

[73] Assignee: Nippon Electric Co., Ltd., Tokyo, Japan

[21] Appl. No.: 45,355

[22] Filed: Jun. 4, 1979

[30] Foreign Application Priority Data

Jun. 2, 1978 [JP] Japan .................................. 53-67125

[51] Int. Cl.³ ............................................. H03D 3/04
[52] U.S. Cl. .................................... 329/126; 329/110; 329/103
[58] Field of Search ............... 329/126, 128, 103, 137, 329/101, 102, 110; 307/233

[56] References Cited

U.S. PATENT DOCUMENTS

| | | | |
|---|---|---|---|
| 3,519,944 | 7/1970 | Avins | 329/137 |
| 4,007,426 | 2/1977 | Utsunomiya | 329/103 |

Primary Examiner—David K. Moore
Attorney, Agent, or Firm—Sughrue, Rothwell, Mion, Zinn and Macpeak

[57] ABSTRACT

An FM demodulator circuit particularly suited for construction as an integrated circuit is disclosed. Circuitry which may also serve the function of an intermediate frequency amplifier and limiter shapes the input FM signal into two rectangular waves having opposite phases which are applied to the bases of first and second transistors. First and second constant current sources supply substantially constant currents to the emitters of the first and second transistors, respectively, and a capacitive element is connected between the emitters of the first and second transistors. An adder circuit adds the collector outputs of the first and second transistors, and the added output is supplied to a low-pass filter to derive an analog output.

6 Claims, 2 Drawing Figures

DEMODULATOR CIRCUIT FOR FREQUENCY-MODULATED SIGNAL

BACKGROUND OF THE INVENTION

The present invention relates to a demodulator circuit for frequency-modulated signals (FM signals), and more particularly, to a demodulator circuit that is suitable to be built in a semiconductor integrated circuit.

As demodulator circuits for FM signals, a stagger-tuned frequency discriminator, a Foster-Seely frequency discriminator, and the like have been heretofore known, and these have been widely used when constructed with discrete parts because these circuits are all simple in circuit construction. However, these circuits were not suitable to be built in a semiconductor integrated circuit because of the disadvantages that they necessitated many capacitors and inductors and also that adjustment of capacitance of the capacitors and/or inductance of the inductors was necessitated.

A demodulator circuit suitable to be built in a semiconductor integrated circuit is shown in U.S. Pat. No. 3,519,944 granted to Jack Avins. In this demodulator circuit, first and second transistors are connected in a differential form, the respective bases of these first and second transistors are coupled to a grounded point via respective capacitors having a small capacity such as, for example, 10 pF, and the collector of the first transistor is connected directly to a power supply, while the collector of the second transistor is coupled through a load resistor to the power supply. In addition, the circuit comprises third and fourth transistors, the emitter-collector path of the third transistor is connected in parallel with the base-collector path of the first transistor, and the emitter and collector of the fourth transistor are connected respectively to the base of the second transistor and to the collector of the first transistor. Between the bases of the third and fourth transistor is connected a parallel resonance circuit consisting of an inductor having an inductance of 20.2 $\mu$H and a capacitor having a capacitance of 62 pF, between the base of third transistor and the ground is connected a capacitor having a small capacitance of 6.8 pF, and between the base of the fourth transistor and the ground is connected a capacitor having a small capacitance of 9.0 pF. An input FM signal is applied to the base of the third transistor, and a demodulated output signal is derived from the collector of the second transistor.

Owing to the parallel resonance circuit and the two capacitors having small capacities of 6.8 pF and 9.0 pF at the respective bases of the third and fourth transistors there are produced signals that have equal amplitudes and opposite phases at a center frequency (Wo), and as the frequency deviates from the center frequency (Wo), one signal increases in amplitude while the other signal decreases in amplitude with a phase difference of 180° maintained therebetween. In this demodulator circuit, demodulation of FM signals is achieved by the first and second transistors and the two capacitors having a small capacitance of 10 pF on the basis of a similar principle to the stagger-tuned frequency discriminator.

Although the aforementioned Anvins FM demodulator circuit can be formed in a semiconductor integrated circuit because of the fact that the number of inductors is only one and every capacitor used therein has a small capacitance, the circuit has disadvantages that at least the single inductor must be provided as an external circuit, that at least five capacitors are necessitated, and if they are formed on the same semiconductor substrate, then a substrate having a considerable area is necessitated, that allowance for circuit parameters of the inductor and capacitors is narrow and thus adjustment of the circuit parameters is required, and that the number of kinds of parts is large and the circuit construction is complex.

SUMMARY OF THE INVENTION

Therefore, it is a major object of the present invention to provide a demodulator circuit for FM signals that is suitable to be formed in a semiconductor integrated circuit.

Another object of the present invention is to provide a demodulator circuit for FM signals in which the number of necessary inductors and capacitors is small and the circuit construction is simple.

Still another object of the present invention is to provide a demodulator circuit for FM signals in which adjustment of circuit parameters is unnecessary.

According to one feature of the present invention, there is provided a demodulator circuit for FM signals which circuit comprises a circuitry for shaping the waveform of an input FM signal into two rectangular waves having opposite phases to each other, first and second transistors adapted to receive the two output waves of the waveform shaping circuitry at their respective bases, first and second constant current sources for supplying substantially constant currents to the emitters of the first and second transistors, respectively, a capacitive element connected between circuit means for coupling the first constant current source to the emitter of the first transistor and circuit means for coupling the second constant current source to the emitter of the second transistor, and a circuitry for adding the collector outputs of the first and second transistors. In addition, in the case where an audio signal is to be derived as a demodulated signal, then it is desirable to apply the output of the adder circuit to a low-pass filter.

In the demodulator circuit for FM signals according to the present invention, no inductor is necessitated at all, and with regard to capacitors, only one capacitor having a large allowance for its capacitance is necessitated. Moreover, as to the waveform shaping circuitry, a differential amplifier that is normally used as an intermediate frequency amplifier associated with an amplitude limiter in the well-known FM radio receiver, can be employed for common use without any particular wave shaper, and hence the number of parts is not increased by the provision of the waveform shaper. Besides, only two constant current sources, two transistors and one adder are necessitated, so that the circuit construction is simple and the number of necessary parts is small. Thus the present invention can provided a demodulator circuit for FM signals that is most suitable to be formed in a semiconductor integrated circuit.

BRIEF DESCRIPTION OF THE DRAWINGS

The above and other features and objects of the invention will become more apparent from the following description taken in conjunction with the accompanying drawings, wherein.

DESCRIPTION OF THE PREFERRED EMBODIMENT

Figure 1:
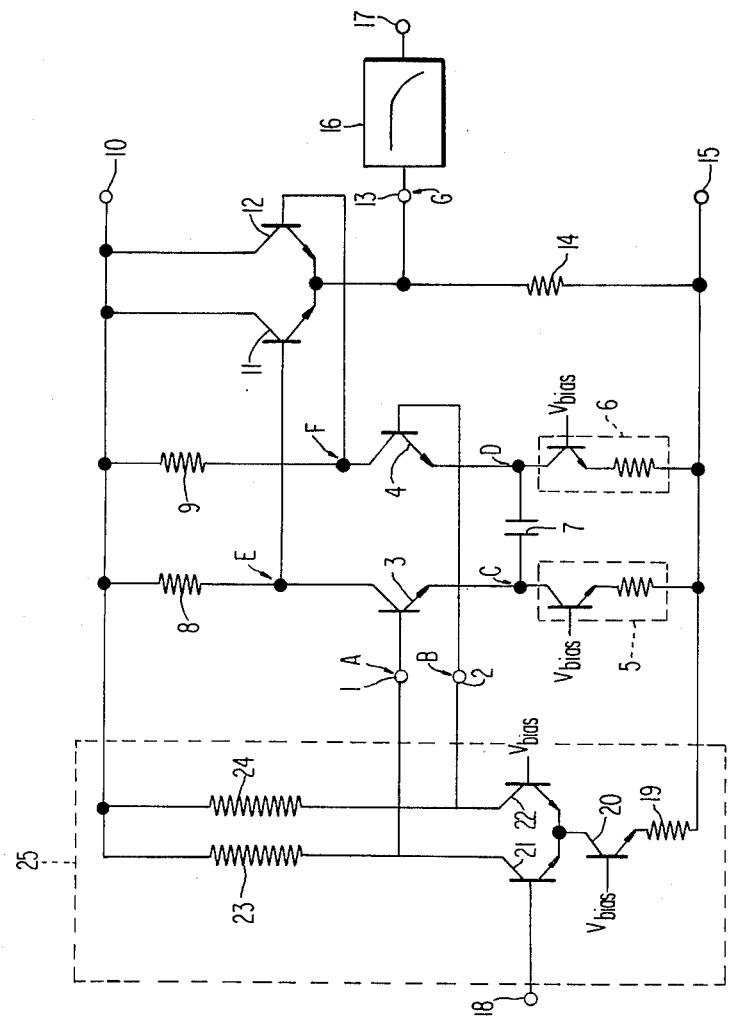
FIG. 1 is a circuit diagram showing one preferred embodiment of the present invention.

Now the construction of the FM demodulator circuit according to one preferred embodiment of the present invention will be described with reference to FIG. 1.

An input FM signal is applied to a waveform shaper circuit 25 through an input terminal 18. This waveform shaper circuit 25 consists of a differential circuit including transistors 21 and 22 which are supplied with their emitter currents from a constant current source consisting a transistor 20 and a resistor 19, and load resistors 23 and 24 for the transistors 21 and 22, respectively. This differential amplifier is so biased that it may achieve limiter operation for converting the input FM signal into pulse waveforms. At the respective collectors of the transistors 21 and 22 are derived output signals having opposite phases to each other, and the output signals are applied to respective bases of transistors 3 and 4 via terminals 1 and 2, respectively. To the emitters of the transistors 3 and 4 are connected constant current sources 5 and 6, respectively, supplying an constant current of 1 mA, and between these emitters is connected a capacitor 7 having a capacitance of 100 pF. Each of the constant current sources 5 and 6 is constructed by a transistor and a resistor. In addition, between the respective collectors of the transistors 3 and 4 and a power supply terminal 10 are respectively connected resistors 8 and 9 each having a resistance of 1 KΩ. More generally, the currents supplied by the constant current source 5 and 6 are selected at 0.3~2 mA, the resistances of the resistors 8 and 9 are selected at 100Ω~10 KΩ, and the product of each such current and such resistance is selected at 0.5~2 V. The respective collector outputs of these transistors 3 and 4 are applied to the respective bases of transistors 11 and 12 which are connected in a differential type. The emitters of the transistors 11 and 12 are connected in common and to a ground terminal 15 via a resistor 14, and also they are connected through a terminal 13 to a low pass filter 16. The differentially connected transistors 11 and 12 serve to add their base input signals at their emitters. The FM signal converted into a pulse form by the waveform shaper circuit 25 is processed in the pulse form up to the terminal 13, but it is converted into an analog signal by the low-pass filter 16 and is output from the output terminal 17, for example, as an audio signal. It is to be noted that the capacitance of the capacitor 7 is selected within the range of 33 to 2000 pF depending upon the FM signal frequency, and that the product of this capacitance and the pulse height (the potential difference between a higher level and a lower level of the pulse) as divided by the constant currents supplied by the constant current sources 5 and 6 must be selected smaller than a reciprocal of twice the FM signal frequency.

Now the operation of the above-described FM demodulator circuit will be explained with reference to FIG. 2.

To the first and second input terminals 1 and 2 are applied rectangular input signal voltages which are 180° out-of-phase to each other as shown at (A) and (B), respectively. A higher level of the input signal voltage is represented by $V_1$, while a lower level thereof is represented by $V_2$, and in the illustrated embodiment these levels are selected respectively at $V_1 = 3.5$ V and $V_2 = 2.5$ V. The input signal at the input terminal 18 is an FM signal, and if it has been subjected to a sufficient limiter action by the waveform shaper circuit 25 prior to its application to the demodulator circuit, the signals at the terminals 1 and 2 can be deemed to be substantially rectangular waves. The electrical state of the circuit shown in FIG. 1 prior to the time $t_1$, shown in FIG. 2, is as follows:

That is, the currents supplied by the current sources 5 and 6 are respectively passed through the resistors 8 and 9 via the transistors 3 and 4, respectively, and accordingly, the terminal voltage across the capacitor 7 connected between the emitters of the transistors 3 and 4 is equal to $V_1 - V_2$.

Figure 2:
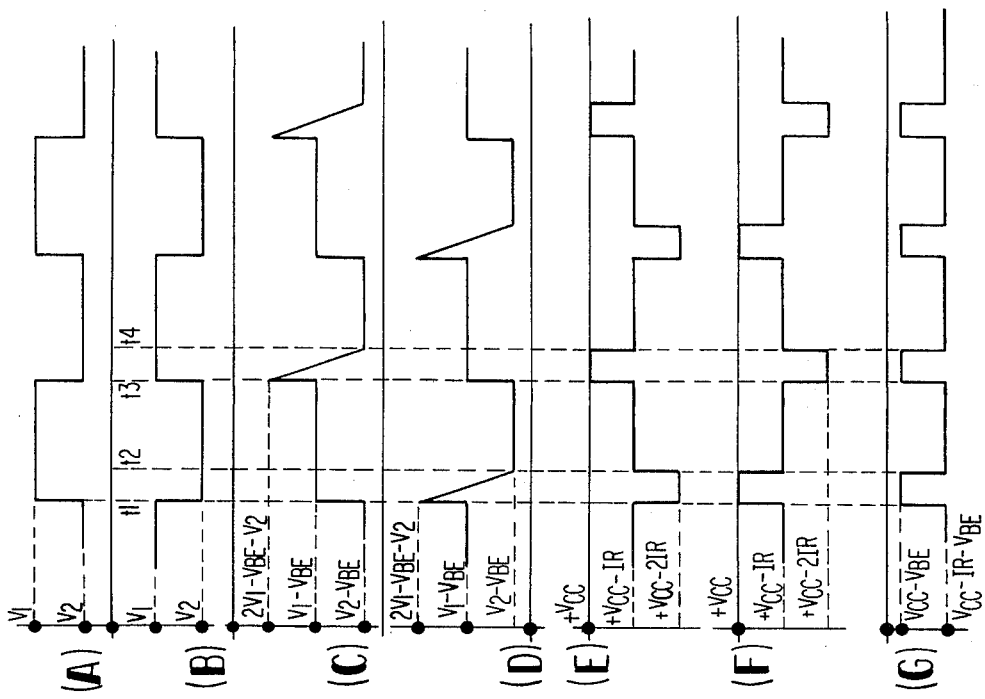
FIG. 2 is a waveform diagram showing the operation of the preferred embodiment illustrated in FIG. 1.

Next, at the time $t_1$, when the input voltage at the terminal 1 rises from $V_2$ to $V_1$ and the input voltage at the terminal 2 falls from $V_1$ to $V_2$, the emitter voltage of the transistor 3 rises from $V_2 - V_{be}$ to $V_1 - V_{be}$ (where $V_{be}$ represents the base-emitter voltage of the transistor) as shown at (C) in FIG. 2. On the other hand, the emitter voltage of the transistor 4 rises at this time point from $V_1 - V_{be}$ to a voltage obtained by adding the charged voltage $V_1 - V_2$ of the capacitor 7 to the emitter voltage of the transistor 3, that is, to $2V_1 - V_2 - V_{be}$ as shown at (D) in FIG. 2. Then the transistor 4 becomes non-conducting.

Thereafter, during the period until time $t_2$, while the current supplied from the constant current source 5 continues to flow through the resistor 8 via the transistor 3 just like the period prior to the time $t_1$, the current supplied from the constant current source 6 flows through the capacitor 7 and flows jointly with the current supplied by the constant current source 5 through the transistor 3 and the resistor 8 because the transistor 4 is non-conducting. Since the current supplied from the constant current source 6 flows through the capacitor 7, the emitter voltage of the transistor 4 falls gradually, and when it has fallen down to $V_2 - V_{be}$ at the time $t_2$, the transistor 4 becomes conducting and the emitter voltage of the transistor 4 is maintained at this voltage $V_2 - V_{be}$.

Here, the relation of $$t_2 - t_1 = \frac{2C(V_1 - V_2)}{I}$$

is fulfilled, where $t_1$: the time when the input signal reversed, $t_2$: the time when the transistor 4 becomes conducting again, C: the capacitance of the capacitor 7, $V_1$: the higher level of the input signal voltage, $V_2$: the lower level of the input signal voltage, and I: the magnitude of the current supplied by each of the constant current sources 5 and 6.

At the time $t_2$, the terminal voltage across the capacitor 7 has an opposite polarity to that before the time $t_1$ and is equal to $V_1 - V_2$. This state continues until the time $t_3$ when the input signal reverses again.

As shown at (E) and (F) in FIG. 2, the collector voltages of the transistors 3 and 4 are both equal to $V_{cc} - IR$ ($V_{cc}$: power supply voltage, R: resistance of each of resistors 8 and 9 which are designed to have an equal resistance) prior to the time $t_1$, but during the period between the time $t_1$ and the time $t_2$ the collector voltage of the transistor 3 falls down to $V_{cc} - 2IR$ and the collector voltage of the transistor 4 rises up to $V_{cc}$, and during the period between the time $t_2$ and the time t3 these collector voltages both become the voltage $V_{cc}-IR$ again.

After the time t3, similarly to the operation described above, the transistor 3 becomes non-conducting and hence the currents supplied by the constant current sources 5 and 6 jointly flow through the transistor 4 and the resistor 9 until time t4.

Thereafter, the same operations are repeated. Then, at the terminal 13 connected to the common emitters of the transistors 11 and 12 is obtained a voltage as shown at (G) in FIG. 2, as a result of adding function of the collector outputs of the transistors 3 and 4. In other words, every time when the input signal reverses, a pulse is derived at the terminal 13. Accordingly, if the signal obtained at the terminal 13 is passed through the low-pass filter 16, then at the output terminal 17 is obtained an analog signal demodulated from the FM signal.

As described above, according to the present invention, an FM demodulator circuit can be constructed by employing only one capacitor without using a coil or an inductor, the circuit construction being very simple, and the number of circuit elements is small, so that the FM demodulator circuit according to the present invention is suitable to be formed in a semiconductor integrated circuit. Moreover since the number of circuit elements connected in series between power supply terminal 10 and the ground terminal 15, especially the number of transistors and diodes having PN-junctions is so small as two in the above embodiment, the demodulator circuit can maintain a stable operation even when the power supply voltage is lowered. In other words, the minimum power voltage is small, and the FM demodulator is preferable for battery drive. In addition, since the FM input signal is converted to rectangular waves and then processed for demodulation, the circuit has advantages that linearity between the input and the demodulated output is good and demodulation distortion can be made small. Furthermore, the FM demodulator circuit according to the present invention has additional advantages that it can be easily operated without adjustment of the capacitance or other circuit parameter and setting of an operating point is very easy as compared to the demodulator circuit employing a coil as in the prior art. In particular, since the locations where the bias voltage setting is required are only at the bases of the transistors 3 and 4, the circuit design of the demodulator circuit according to the present invention can be easily achieved.

In addition, description will be made on the case where the present invention is applied to an FM radio receiver. In an FM radio receiver, normally a received signal is converted into an intermediate frequency signal having a frequency of 10.7 MHz, then after this intermediate frequency signal is amplified and subjected to an amplitude limiting process to remove an AM noise and, the signal is frequency-demodulated. In this case, both of the amplification and amplitude limiting of the intermediate frequency signal are often achieved at the same time by a single differential amplifier. Since the waveform shaper circuit 25 in the above-described embodiment of the present invention is a differential amplifier, it is possible by a minor arrangement to use the waveform shaper circuit 25 as the amplitude limiting intermediate frequency amplifier. In other words, if the output signals having opposite phases to each other are derived from the differential amplifier used as the amplitude limiting intermediate frequency amplifier in the FM radio receiver, there is no need to add a separate waveform shaper circuit.

What is claimed is:

1. A demodulator circuit for frequency-modulated signals comprising a wave form shaper circuitry for shaping an input FM signal into two rectangular waves having opposite phases to each other, first transistor adapted to receive one of said rectangular waves derived from said waveform shaper circuitry, second transistor adapted to receive the other of said rectangular waves derived from said waveform shaper circuitry, first and second constant current sources, first circuit means for supplying the output current of said first constant current source to the emitter of said first transistor, second circuit means for supplying the output current of said second constant current source to the emitter of said second transistor, a capacitive element connected between said first and second circuit means, and an adder circuit for adding the collector outputs of said first and second transistors together.

2. A demodulator circuit for frequency-modulated signals as claimed in claim 1, further comprising a low-pass filter for converting the output signal of said adder circuit into an analog signal.

3. A demodulator circuit for frequency modulated signals constructed in a FM radio receiver, comprising an intermediate frequency amplifier amplifying an intermediate frequency FM signal and deriving two rectangular waves having opposite phases to each other, first transistor adapted to receive one of said rectangular waves derived from said intermediate frequency-amplifier, second transistor adapted to receive the other of said rectangular waves derived from said intermediate frequency-amplifier, first and second constant current sources, first circuit means for supplying the output current of said first constant current source to the emitter of said first transistor, second circuit means for supplying the output current of said second constant current source to the emitter of said second transistor, a capacitive element connected between said first and second circuit means, an adder circuit for adding the collector outputs of said first and second transistors together, and a low-pass filter for converting the output signal of said adder circuit into an analog signal.

4. A demodulator circuit for frequency-modulated signals as claimed in claim 1 wherein said wave form shaper circuitry comprises third and fourth transistors, a third constant current source connected to the emitters of said third and fourth transistors, the base of said third transistor being supplied with said input FM signal and the base of said fourth transistor being supplied with a bias voltage, and the collectors of said third and fourth transistors being connected to the bases of said first and second transistors, respectively.

5. A demodulator circuit for frequency-modulated signals as claimed in claim 3 wherein said intermediate frequency amplifier comprises third and fourth transistors, a third constant current source connected to the emitters of said third and fourth transistors, the base of said third transistor being supplied with said input FM signal and the base of said fourth transistor being supplied with a bias voltage, and the collectors of said third and fourth transistors being connected to the bases of said first and second transistors, respectively.

6. A demodulator circuit for frequency-demodulated signals as claimed in claim 1 or 3 wherein said adder circuit comprises a pair of differentially connected transistors having a common load impedance connected to their emitters, the collector outputs of said first and second transistors being connected to respective ones of the bases of said differentially connected pairs of transistors.

* * * * *

UNITED STATES PATENT AND TRADEMARK OFFICE
CERTIFICATE OF CORRECTION

PATENT NO. : 4,264,867
DATED : April 28, 1981
INVENTOR(S) : Eiichi ISHII

It is certified that error appears in the above—identified patent and that said Letters Patent is hereby corrected as shown below:

Column 6, line 60, delete "frequency-demodulated" and insert -- frequency-modulated -- .

Signed and Sealed this

Twenty-fifth Day of August 1981

[SEAL]

Attest:

GERALD J. MOSSINGHOFF

Attesting Officer

Commissioner of Patents and Trademarks